(12) United States Patent
Bartley et al.

(10) Patent No.: US 8,642,456 B2
(45) Date of Patent: Feb. 4, 2014

(54) IMPLEMENTING SEMICONDUCTOR SIGNAL-CAPABLE CAPACITORS WITH DEEP TRENCH AND TSV TECHNOLOGIES

(75) Inventors: Gerald K. Bartley, Rochester, MN (US); Philip R. Germann, Oronoco, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/449,480

(22) Filed: Apr. 18, 2012

(65) Prior Publication Data

US 2013/0277798 A1 Oct. 24, 2013

(51) Int. Cl.
*H01L 21/425* (2006.01)
(52) U.S. Cl.
USPC .................... 438/525; 438/667; 257/E21.585
(58) Field of Classification Search
USPC ........................ 438/525, 667; 257/E21.586
See application file for complete search history.

(56) References Cited

U.S. PATENT DOCUMENTS

| | | | |
|---|---|---|---|
| 5,348,905 A | 9/1994 | Kenney | |
| 5,846,879 A * | 12/1998 | Winnerl et al. | 438/675 |
| 6,281,068 B1 | 8/2001 | Coronel et al. | |
| 6,373,086 B1 | 4/2002 | Mandelman et al. | |
| 6,495,454 B2 * | 12/2002 | Livengood et al. | 438/667 |
| 6,544,856 B2 | 4/2003 | Morhard et al. | |
| 6,821,844 B2 | 11/2004 | Hsu | |
| 6,946,344 B2 | 9/2005 | Chou et al. | |
| 8,362,591 B2 * | 1/2013 | Yen et al. | 257/595 |
| 2011/0204524 A1 | 8/2011 | Hannon et al. | |

* cited by examiner

*Primary Examiner* — Chandra Chaudhari
(74) *Attorney, Agent, or Firm* — Joan Pennington

(57) ABSTRACT

A method and structures are provided for implementing semiconductor signal-capable capacitors with deep trench and Through-Silicon-Via (TSV) technologies. A deep trench N-well structure is formed and an implant is provided in the deep trench N-well structure with a TSV formed in a semiconductor chip. At least one angled implant is created around the TSV in a semiconductor chip. The TSV is surrounded with a dielectric layer and filled with a conducting material which forms one electrode of the capacitor. A connection is made to one implant forming a second electrode to the capacitor.

8 Claims, 9 Drawing Sheets

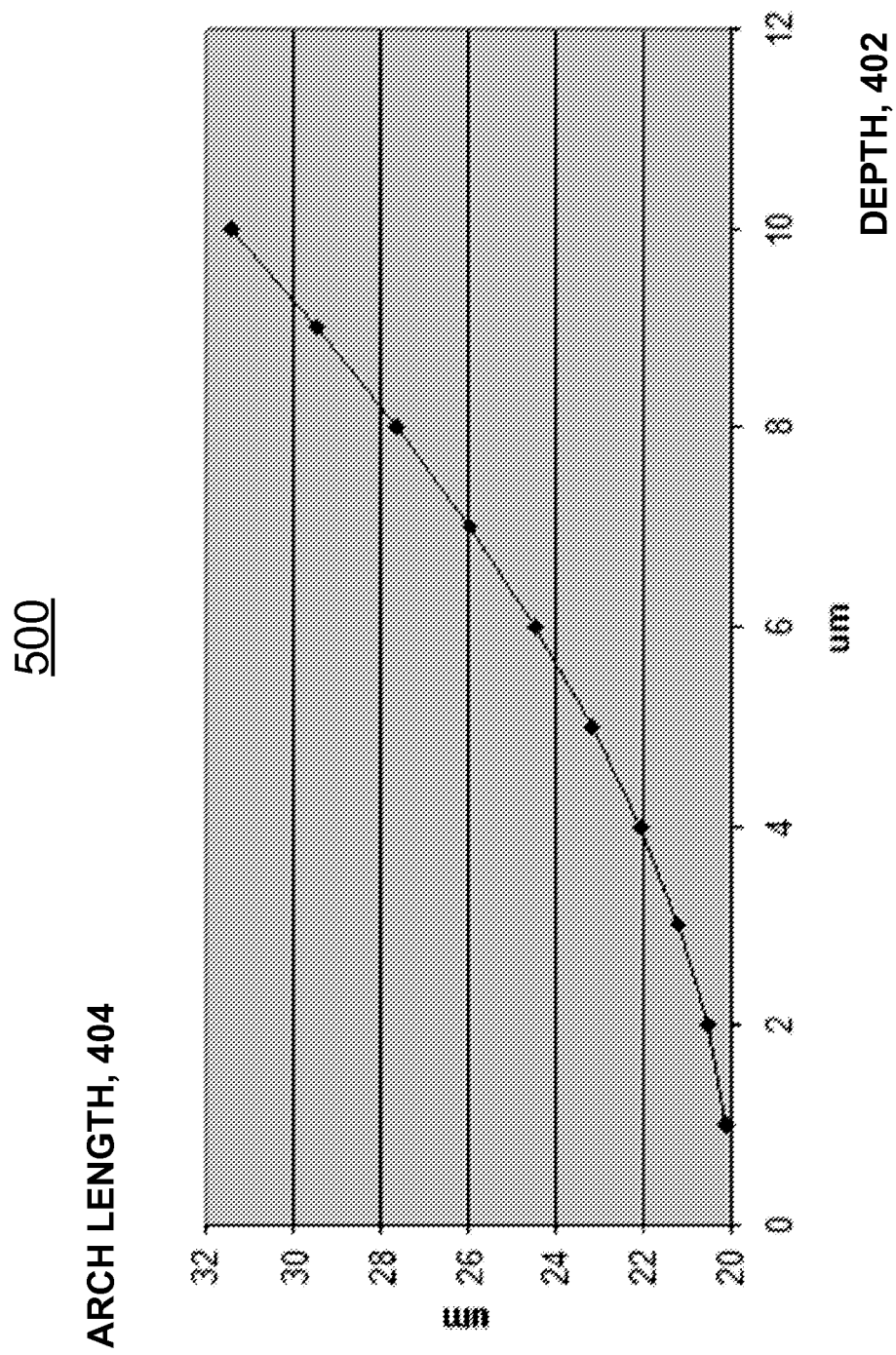

| | REGION | Full Vertical R | C/TSV | RC |
|---|---|---|---|---|
| ① 601 | Capacitance surface rho ~50 Ohm-um | .3 ohm | .2pF | .6pS |
| ② 602 | NWell sheet rho ~500 Ohm-um | 3.3 ohm | 1.8pF | 6pS |
| ③ 604 | NWell Bridge rho ~2K Ohm-um | 200 ohm | 13pF | 2.6nS |
| ④ 606 | NWell Collar rho ~5K Ohm-um | 1700 ohm | 15pF | 25nS |

IMPLEMENTING SEMICONDUCTOR SIGNAL-CAPABLE CAPACITORS WITH DEEP TRENCH AND TSV TECHNOLOGIES

FIELD OF THE INVENTION

The present invention relates generally to the data processing field, and more particularly, relates to a method and structures for implementing semiconductor signal-capable capacitors with deep trench and Through-Silicon-Via (TSV) technologies.

DESCRIPTION OF THE RELATED ART

Adequate capacitive density capacitors have been fabricated utilizing thin dielectric gate insulator films as well as deep trench capacitor topologies. Both of these approaches have been limited to power supply decoupling capacitors with at least one and typically both of the capacitor nodes tied to power supplies.

Signal or in-line capacitors are typically built from relatively low capacitive density structures such as between back end of line (BEOL) metal layers or between adjacent metal wires on a given plane. These capacitors tie up valuable real estate and yet typically provide far less than the desired capacitance.

Through-Silicon-Via (TSV) or TSV interconnections are used for various semiconductor chips and semiconductor chip stacking devices. Integrated circuit die stacking with packaging through silicon via (TSV) interconnections and other packaging techniques enable interconnecting die in ultra close proximity using the vertical dimension. These arrangements enable higher performance and packaging density.

A need exists for an effective mechanism and method of fabricating a signaling capacitor which fulfills the signaling requirements without the disadvantages of current methods for building signaling capacitors.

SUMMARY OF THE INVENTION

Principal aspects of the present invention are to provide a method and structures for implementing semiconductor signal-capable capacitors with deep trench and Through-Silicon-Via (TSV) technologies. Other important aspects of the present invention are to provide such method and structures substantially without negative effects and that overcome many of the disadvantages of prior art arrangements.

In brief, a method and structures are provided for implementing semiconductor signal-capable capacitors with deep trench and Through-Silicon-Via (TSV) technologies. A deep trench N-well structure is formed and an implant is provided in the deep trench N-well structure with a Through-Silicon-Via (TSV) formed in a semiconductor chip. At least one angled implant is created around the Through-Silicon-Via (TSV) in a semiconductor chip. The TSV is surrounded with a dielectric layer and filled with a conducting material which forms one electrode of the capacitor. A connection is made to one implant forming a second electrode to the capacitor.

In accordance with features of the invention, the deep trench N-well structure includes an N+ implant in a P− substrate.

In accordance with features of the invention, the N-well structures embedded surrounding the TSV, together with the center conductor and separated by a layer of dielectric material; generate the semiconductor signal-capable capacitor with a required capacitance.

In accordance with features of the invention, the dielectric layer surrounding the TSV includes a dielectric material that may have a relative permittivity of about 40 and may have a thickness of about 400 Angstroms.

BRIEF DESCRIPTION OF THE DRAWINGS

The present invention together with the above and other objects and advantages may best be understood from the following detailed description of the preferred embodiments of the invention illustrated in the drawings, wherein:

FIGS. 3, 4A, 4B, and 5 illustrate example geometries for fabricating semiconductor signal-capable capacitors with deep trench and TSV technologies in accordance with the preferred embodiments;

FIGS. 6A, and 6B illustrate an example semiconductor signal-capable capacitor structure with deep trench and TSV technologies in accordance with the preferred embodiment

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structures are provided for implementing semiconductor signal-capable capacitors with deep trench and Through-Silicon-Via (TSV) technologies.

Figure 1:
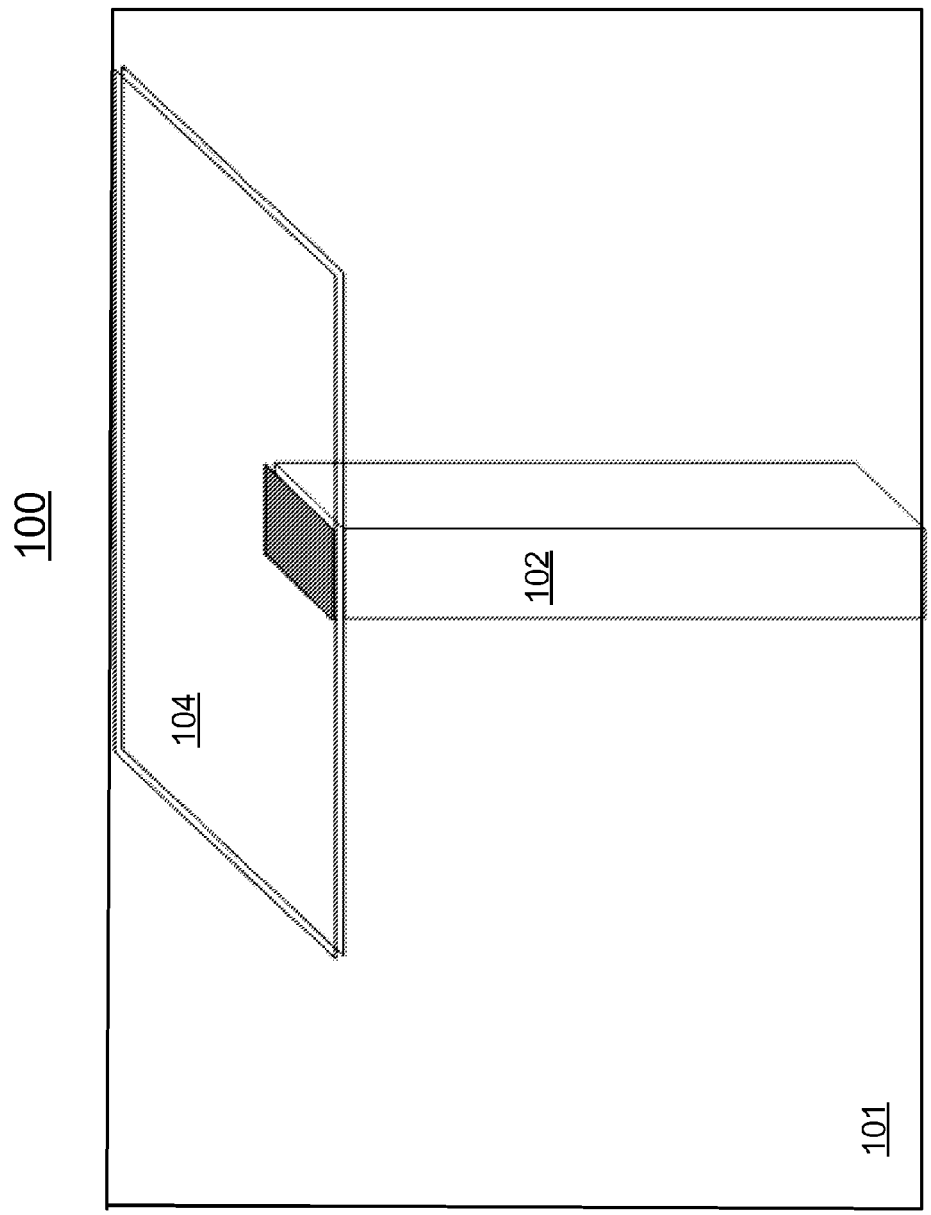
FIGS. 1 and 2 schematically show respective isometric views of exemplary processing steps for fabricating semiconductor signal-capable capacitors with deep trench and TSV technologies in accordance with the preferred embodiment.
Figure 2:
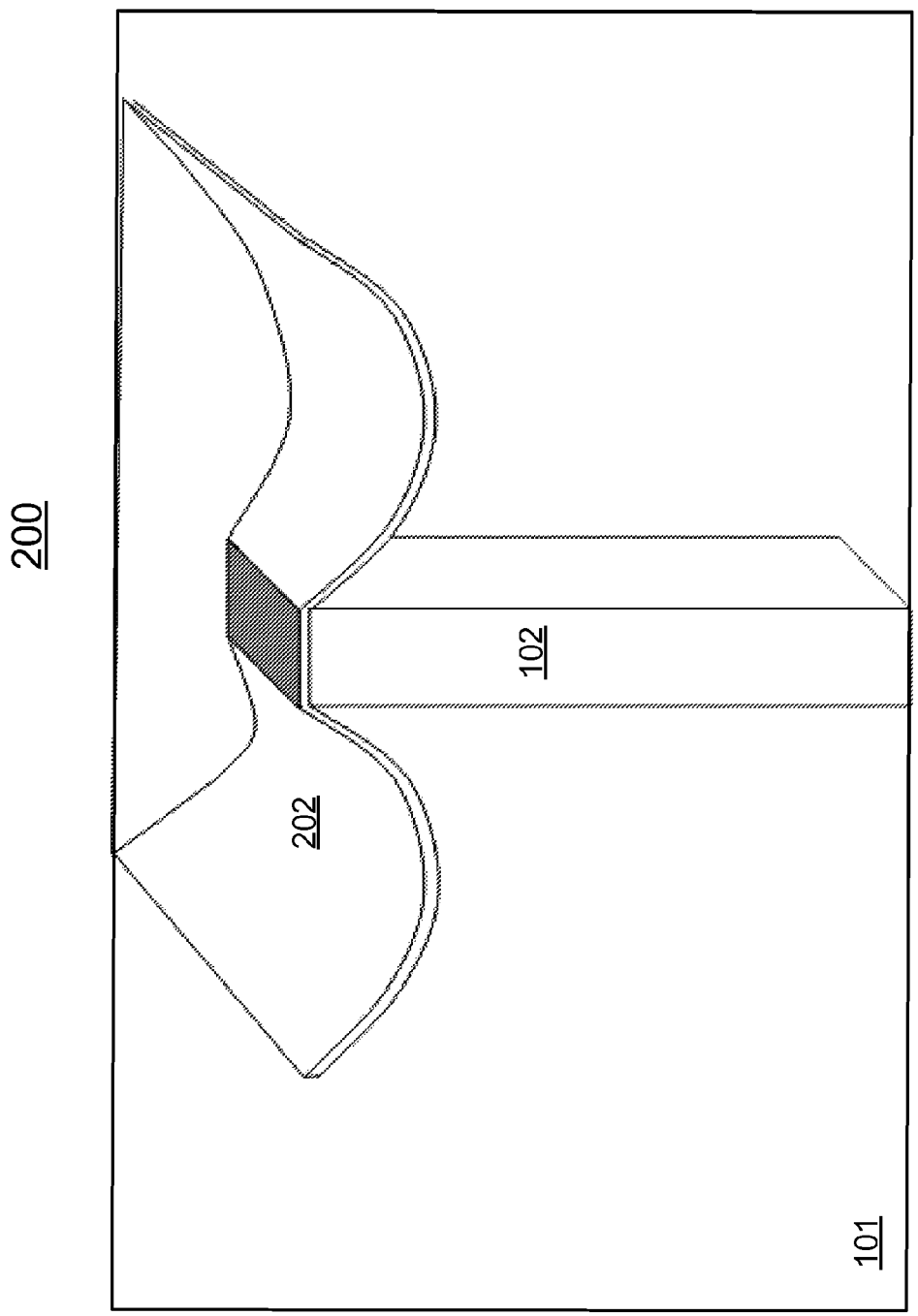

Referring now to FIG. 1 and FIG. 2, there is schematically shown respective partial isometric views of exemplary processing steps for fabricating semiconductor signal-capable capacitors with deep trench and Through-Silicon-Via (TSV) technologies respectively generally designated by the reference character 100 and generally designated by the reference character 200 in accordance with the preferred embodiment.

In FIG. 1, in a first step 100, a semiconductor substrate 101 formed of a suitable material such as a silicon substrate 101 includes at least one Through-Silicon-Via (TSV) region 102 shown extending through the silicon wafer or die, and an N-well region or N+ area 104 defined to be masked.

FIG. 2 illustrates first stage 200 where a deep trench or sheet N-well structure 202 is created relative to the TSV region 102 to be processed.

Referring also to FIGS. 3, 4A, 4B, and 5 illustrate example geometries for fabricating semiconductor signal-capable capacitors with deep trench and Through-Silicon-Via (TSV) technologies in accordance with the preferred embodiments.

Figure 3:
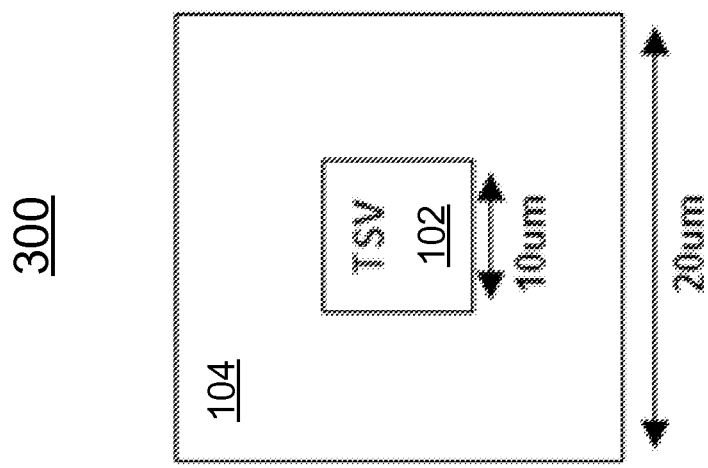

In FIG. 3, an example geometry 300 includes the TSV region 102 includes a rectangular area with a length of approximately 10 μm located within the N-well region or N+ area 104 include a rectangular area with a length of approximately 20 μm. It should be understood that these regions need not be rectangular, and will likely include some circular or elliptical geometry. These differences do not significantly affect or reduce the advantages of the invention.

Figures 4A, 4B:
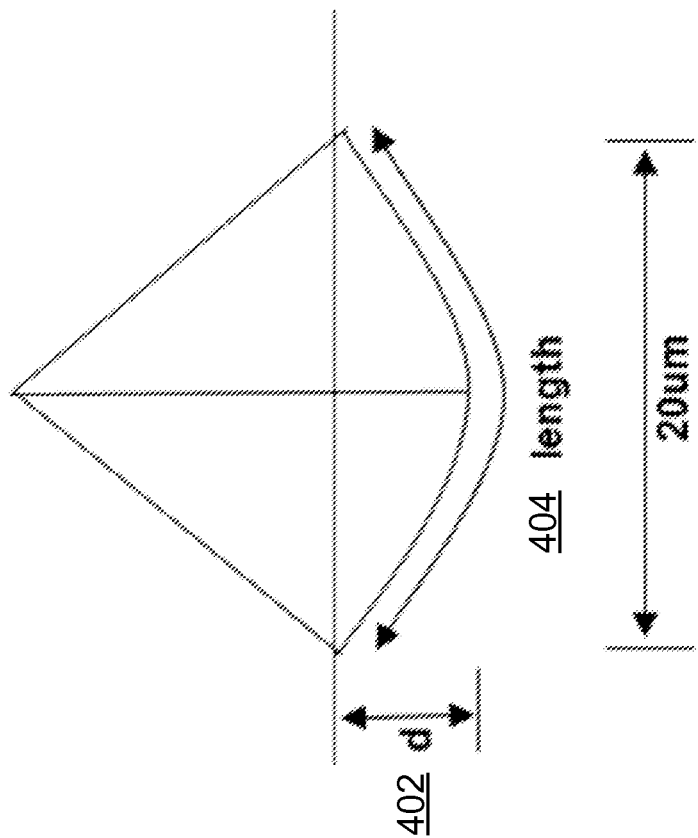

In FIG. 4A, an example deep trench or sheet N-well structure 400 is shown with a selected depth d, 402 together with a selected arch length 404. FIG. 4B provides a table 410 including example values of the selected depth d, 402 together with the selected arch length 404 for the deep trench N-well structure 400.

FIG. 5 provides a chart generally designated by the reference character 500 illustrating example values of the selected depth d, 402 together with the relationship to the selected arch length 404 for the deep trench N-well structure 400.

Figure 6A:
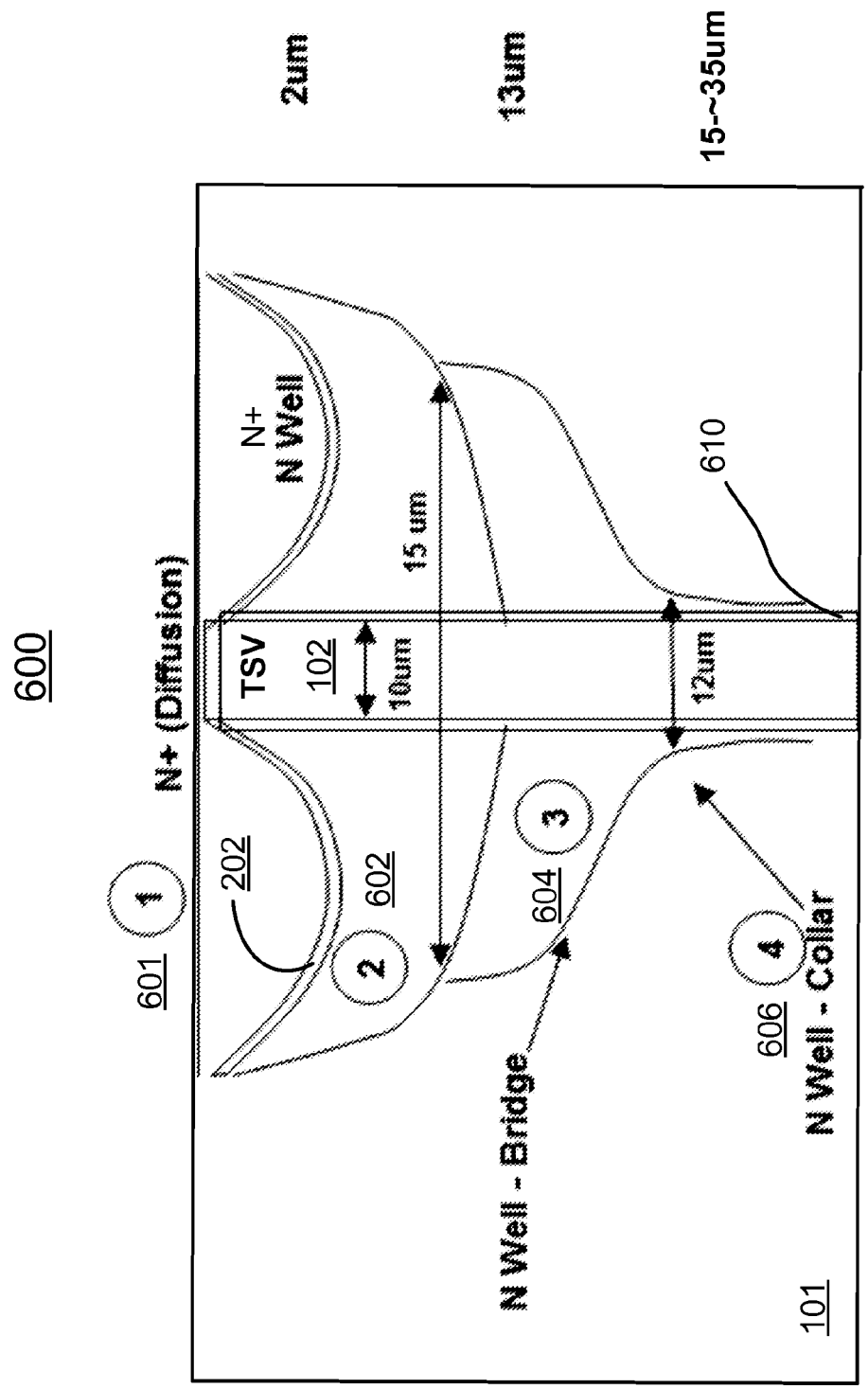

Referring also to FIG. 6A, there is shown an example semiconductor signal-capable capacitor structure generally designated by the reference character 600 with deep trench and Through-Silicon-Via (TSV) technologies in accordance with the preferred embodiment. The semiconductor signal-capable capacitor structure 600 includes a plurality of N-well regions #1-4, 601, 602, 604, 606 surrounding a dielectric layer 610 which surrounds the TSV 102, which are shown with example dimensions.

Referring also to FIG. 6B, there is shown an example capacitance calculation generally designated by the reference character 620 for the semiconductor signal-capable capacitor structure 600 of FIG. 6A. The example capacitance calculation 620 is based upon dielectric material having a thickness of approximately 400 angstrom (400 Å or 40.0 nm) and having a relative permittivity of about 40, including example full vertical resistance R, capacitance C and the time constant product RC values for the plurality of N-well regions #1-4, 601, 602, 604, 606.

As shown in FIGS. 6A, and 6B, the capacitor structure region #1, 601 is a capacitance surface of N+ diffusion and includes the N-well region 202. The capacitor structure region #2, 602 includes the N-well sheet region. The capacitor structure region #3, 604 includes the N-well bridge region. The capacitor structure region #4, 606 includes the N-well collar region.

Figure 7A:
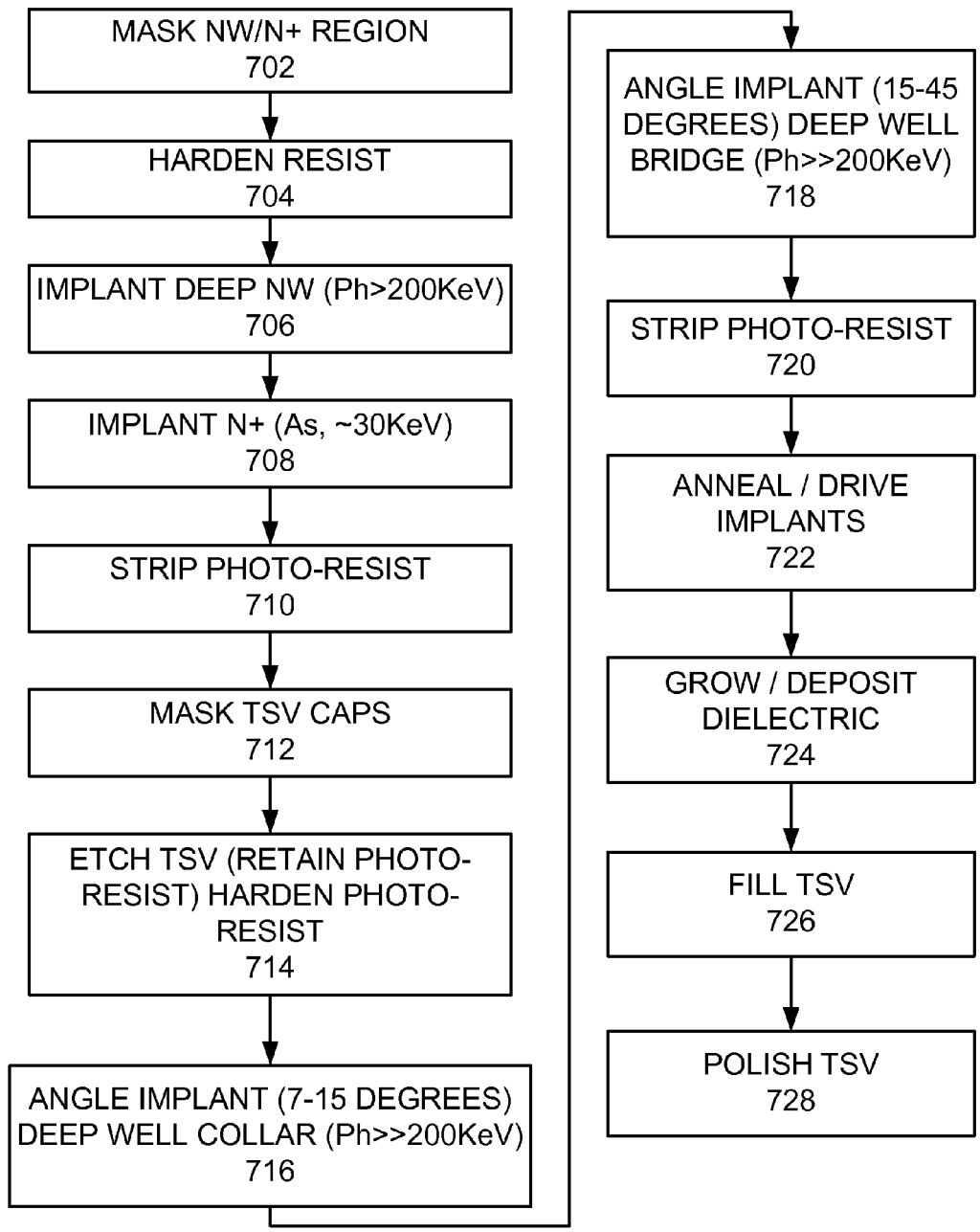
FIG. 7A is a flow chart illustrating exemplary processing steps for fabricating semiconductor signal-capable capacitors with deep trench and TSV technologies in accordance with the preferred embodiment.

FIG. 7A is a flow chart illustrating exemplary processing steps for fabricating semiconductor signal-capable capacitors with deep trench and Through-Silicon-Via (TSV) technologies in accordance with the preferred embodiment, such as the semiconductor signal-capable capacitor structure 600 illustrated and described with respect to FIG. 6A.

As indicated at a block 702 an N-well/N+ region is masked in the semiconductor chip and the mask resist is harden as indicated at a block 704. Next a deep N-well implant is formed including photon energy Ph of greater than 200 KeV as indicated at a block 706. The deep trench N-well structure has a selected depth in a range of approximately 2-10 μm.

An implant such as an N+ implant with a P− substrate 101 of the semiconductor chip is provided in the N-well as indicated at a block 708. For example, the N+ implant is an arsenic implant provided at photon energy Ph of approximately 30 KeV. As indicated at a block 710, the photo-resist is stripped. Next TSV caps are masked, for example for the TSV region 102, of FIGS. 1, 2, and 6, as indicated at a block 712. The TSV region 102 is etched, retaining and hardening photo-resist as indicated at a block 714.

As indicated at a block 716, a deep N-well collar structure, such as N-well collar 606 shown in FIG. 6A, is created with a first angled implant in a range of approximately 7-15 degrees including photon energy Ph of much greater than 200 KeV. Then the N-well bridge structure, such as N-well bridge 604 shown in FIG. 6A, is created with a second angled implant in a range of approximately 15-45 degrees also including photon energy Ph of much greater than 200 KeV as indicated at a block 718. Then the TSV region photo-resist is stripped as indicated at a block 720. As indicated at a block 722, an anneal/drive implants step provided for the N-well bridge and collar structures.

A dielectric layer, such as dielectric 610 of FIG. 6A, is grown or deposited as indicated at a block 724. The dielectric layer includes, for example, a dielectric material having a thickness of approximately 400 angstrom an having a relative permittivity of about 40, such as shown in the example capacitance calculation 620 of FIG. 6B.

As indicated at a block 726, the TSV is filled with a suitable electrically conductive material, for example, of titanium, copper, tungsten, aluminum, Al (Cu), or other conventional conductive material used for TSVs. As indicated at a block 728, then the TSV is polished.

Figure 7B:
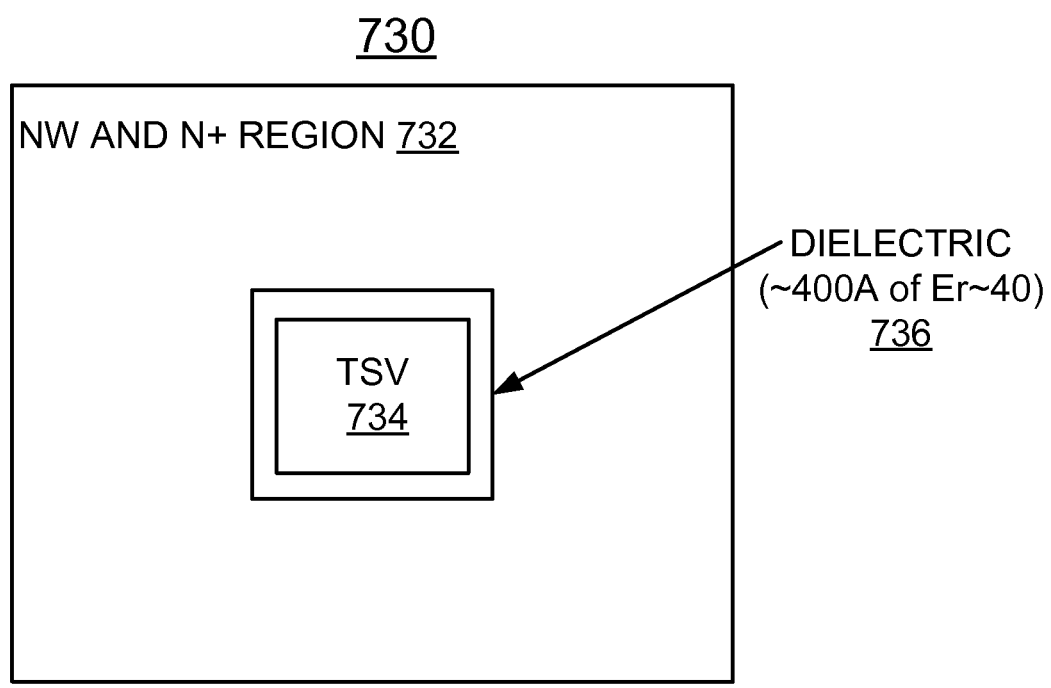
FIG. 7B illustrates an example top plan view of an example fabricated semiconductor signal-capable capacitor with deep trench and TSV technologies in accordance with the preferred embodiments.

FIG. 7B illustrates an example top plan view of an example resulting semiconductor signal-capable capacitor generally designated by the reference character 730 fabricated by the process of FIG. 7A with deep trench and Through-Silicon-Via (TSV) technologies in accordance with the preferred embodiments.

As shown the semiconductor signal-capable capacitor 730 includes an N-well N+ region 732 with a TSV 734 surrounded by a dielectric 736, such having a thickness of approximately 400 angstrom an having a relative permittivity of about 40. The TSV 734 forms one electrode of the fabricated semiconductor signal-capable capacitor 730. An N+ implant forms a second electrode to the fabricated semiconductor signal-capable capacitor 730.

While the present invention has been described with reference to the details of the embodiments of the invention shown in the drawing, these details are not intended to limit the scope of the invention as claimed in the appended claims.

What is claimed is:

1. A method for implementing semiconductor signal-capable capacitors comprising:
   forming and implanting a deep trench N-well structure including masking an N-well region; hardening a mask photo-resist; forming and implanting said deep trench N-well structure; and removing said photo-resist;
   etching a Through-Silicon-Via (TSV);
   creating a plurality of N-well structures surrounding said TSV with at least one angled implant;
   depositing a dielectric layer surrounding said TSV; and
   filling said TSV filled with a conducting material.

2. The method as recited in claim 1 wherein masking said N-well region includes masking a rectangular area with a length of approximately 20 μm.

3. The method as recited in claim 1 wherein creating said plurality of N-well structures surrounding said TSV with at least one angled implant includes providing a first angled implant through said etched TSV in a range of approximately 7-15 degree with photon energy greater than 200 KeV.

4. The method as recited in claim 1 wherein creating said plurality of N-well structures surrounding said TSV with at least one angled implant includes providing a second angled implant through said etched TSV in a range of approximately 7-15 degree with photon energy greater than 200 KeV.

5. The method as recited in claim 1 wherein depositing said dielectric layer surrounding said TSV includes depositing a dielectric material surrounding said TSV having a relative permittivity of about 40 and a thickness of approximately 400 angstrom.

6. The method as recited in claim 1 includes forming and implanting said deep trench N-well structure includes forming said deep trench N-well structure having a selected depth in a range of approximately 2-10 μm and a selected arch length in a range of approximately 20-31 μm.

7. A method for implementing semiconductor signal-capable capacitors comprising:
   forming and implanting a deep trench N-well structure
   etching a Through-Silicon-Via (TSV) including masking a Through-Silicon-Via (TSV) region; etching said Through-Silicon-Via (TSV) retaining and hardening photo-resist;
   creating a plurality of N-well structures surrounding said TSV with at least one angled implant;
   depositing a dielectric layer surrounding said TSV; and
   filling said TSV filled with a conducting material.

8. The method as recited in claim 7 wherein masking said Through-Silicon-Via (TSV) region includes masking said TSV region having a rectangular area with a length of approximately 10 μm.

* * * * *